United States Patent
Tsai et al.

[11] Patent Number: 5,899,748
[45] Date of Patent: May 4, 1999

[54] METHOD FOR ANCHORING VIA/CONTACT IN SEMICONDUCTOR DEVICES AND DEVICES FORMED

[75] Inventors: Chia Shiung Tsai, Hsin-Chu; Hun-Jan Tao, Hsinchu, both of Taiwan

[73] Assignee: Taiwan Semiconductor Manufacturing Co., Ltd., Hsin-Chu, Taiwan

[21] Appl. No.: 08/859,863

[22] Filed: May 21, 1997

[51] Int. Cl.$^6$ .................................................. H01L 21/00
[52] U.S. Cl. .................... 438/707; 216/6; 216/18; 438/738; 438/743; 257/774
[58] Field of Search ........................ 438/723, 738, 438/739, 743, 756, 707; 216/17, 6, 18, 79, 99; 257/750, 773, 774, 775

[56] References Cited

U.S. PATENT DOCUMENTS

| | | | |
|---|---|---|---|
| 4,543,707 | 10/1985 | Ito et al. | 438/743 X |
| 5,677,222 | 10/1997 | Tseng | 438/739 X |

*Primary Examiner*—William Powell
*Attorney, Agent, or Firm*—Tung & Associates

[57] ABSTRACT

The present invention discloses a noel method for anchoring a via/contact or the forming of a capacitor having increasing capacitance in a semiconductor device by utilizing alternating layers of BPTEOS oxide and TEOS oxide and a deep UV photoresist such that toroidal-shaped cavities can be formed at the interfaces between the BPTEOS oxide layers and the TEOS oxide layers during the formation of the via/contact opening or the capacitor opening by a plasma etching process. The number of cavities formed, i.e., the number of anchors formed on the via/contact or capacitor, can be suitably adjusted by the number of BPTEOS oxide layer deposited on the semiconductor structure. Each BPTEOS oxide layer produces two anchors on the via/contact or the capacitor. The deep UV photoresist layer should contain a photo-acid-generator such that hydrogen ions are emitted when the photoresist layer is subjected to UV radiation and heating which accelerates the hydrogen ion generation process. The hydrogen ions generated combines with the fluorine contained in the oxide forming HF for etching away the interface between the two different oxide layers where boron ions and phosphorous ions are saturated at such interfaces.

26 Claims, 1 Drawing Sheet

METHOD FOR ANCHORING VIA/CONTACT IN SEMICONDUCTOR DEVICES AND DEVICES FORMED

FIELD OF THE INVENTION

The present invention generally relates to a method for anchoring via/contact in semiconductor devices and the devices formed, and more particularly, relate to a method for anchoring via/contact in semiconductor devices by an in-situ etching step at the interfaces between TEOS oxide and BPTEOS oxide layers where the boron and phosphorous ions are saturated to form toroidal-shaped cavities such that anchors on the via/contact can be formed after it is filled with a conductive metal.

BACKGROUND OF THE INVENTION

In the manufacture of semiconductor devices, metal vias and contacts are deposited into via openings and contact holes on semi-conducting wafers that have been preprocessed. Semiconductor devices are thus formed connected to each other by the metal vias and contacts to form an integrated circuit. In particular, aluminum, aluminum alloys, tungsten and tungsten alloys are frequently used for deposition into the via openings and contact holes on the semi-conducting substrate. These deposition processes can be carried out by a physical vapor deposition (or sputtering) or a chemical vapor deposition technique.

As semiconductor devices are continuously being made smaller in a total miniaturization effort for achieving devices on the sub-path-micron scale, the via openings and the contact holes must also be made smaller. Consequently, the openings and the holes to be filled have higher aspect ratios, i.e., the depth of the opening or hole divided by its diameter becomes higher.

Difficulties are encountered in depositing a conductive metal into via openings and contact holes by conventional sputtering processes when such openings or holes have high aspect ratios. As the openings and holes become smaller and deeper, the bottom and sides of an opening or hole receive fewer deposited metal particles then the top surface of the device. The end result of such a phenomenon, sometimes called shadowing effect, is that the metal layers formed by the particles hangs over the opening forming an overhang. Such overhang closes before the opening is filled as the deposition process progresses and thus creating a void in the opening or hole.

One technique that has been used to compensate for the shadowing effect of the sputtering process is to taper the sidewalls of the via openings or the contact holes. For instance, during the formation, i.e., by a dry etching or reactive ion etching process, the top of the opening or hole is etched more than the bottom of the opening or hole. The sidewalls of the opening therefore may have an inclined of 15° with the vertical axis that is parallel with the length of the opening. The tapered via opening or contact hole correct significantly the under-fill or shadowing effect of the sputtering process, for instance, by aluminum particles. However, the tapered via or contact formed after fill by aluminum and then etched back, have the drawback of popping out of the via opening or contact hole or fails in a defect known as via delamination. The via delamination defect can be severe in a semiconductor device since the device, after formation of the via or contact, may be subjected to various thermal cycling processes encountered in various etching, passivation or planarization processes. The expansion or contraction of the metal via or contact caused by such thermal stress during cycling can easily delaminate the via or contact from its opening or hole. When the via delamination defect occurs, the circuit in the semiconductor device fails and thus the yield of the semiconductor wafer is significantly affected.

It is therefore an object of the present invention to provide a method of filling via openings and contact holes that does not have the drawbacks and shortcomings of the conventional methods.

It is another object of the present invention to provide a method for filling openings and contact holes that are slightly tapered with the top opening larger than the bottom opening by built-in anchors in the sidewalls of the via or contact.

It is a further object of the present invention to provide a method for filling via openings or contact holes by providing anchors on the via or contact in-situ as an integral part of the process recipe.

It is still another object of the present invention to provide a method for filling via openings and contact holes with a conductive metal such that the via and the contact subsequently formed does not have a delamination problem.

It is still another object of the present invention to provide a method for filling via openings or contact holes by a conductive metal by utilizing a deep UV photoresist which contains a photo-acid-generator.

It is yet another object of the present invention to provide a method for filling via openings and contact holes with a conductive metal by coating the sidewalls of the openings or holes with a flooring and hydrogen containing organic compound formed from the deep UV photoresist such that anchors can be etched onto the opening.

It is still another further object of the present invention to provide a method for forming vias or contacts in alternating layers of BPTEOS oxide and TEOS oxide by forming toroidal-shaped cavities at the interfaces between layers of different materials.

It is yet another further object of the present invention to provide a method for forming vias and contacts on a semiconductor device by using a deep UV photoresist and subjecting such photoresist to UV radiation such that the sidewalls of the via opening or hole can be etched into cavities for forming anchors on the via or contact.

SUMMARY OF THE INVENTION

In accordance with the present invention, a method for forming via or contact on a semiconductor device that does not have a delamination problem by forming anchors on the via or contact is provided.

In a preferred embodiment, a method for anchoring a via/contact in an electronic device can be carried out by first providing an electronic device, then depositing at least one layer of BPTEOS oxide and at least two layers of TEOS oxide layer in an alternating manner with the BPTEOS oxide layer sandwiched in-between the TEOS oxide layers forming at least two interfaces between the layers of different materials, then depositing a photoresist that includes a photo-acid-generator on top of a TEOS oxide layer, and then exposing the photoresist layer to a UV radiation prior to or during a plasma etching process in which a via/contact opening is opened in the layers of BPTEOS oxide and TEOS oxide, the etching process being conducting for a length of time sufficient to form at least two toroidal-shaped cavities integral with the opening at the at least two interfaces.

In another preferred embodiment, a method for preventing via/contact delamination in a semiconductor device can be carried out by the steps of first providing a pre-processed semiconductor device, then depositing alternating layers of TEOS oxide and BPTEOS oxide forming at least one sandwiched structure of a BPTEOS oxide layer sandwiched in-between two TEOS oxide layers and at least two interfaces between the BPTEOS oxide and the TEOS oxide layers, then depositing a layer of photoresist material including a photo-acid-generator on top of one of the TEOS oxide layers, then exposing the photoresist to a UV radiation, then plasma etching a via/contact opening in the alternating layers of TEOS oxide and BPTEOS oxide and coating the sidewalls of the via/contact opening with a flooring and hydrogen containing organic compound formed by the photoresist material, and then forming at least two toroidal-shaped cavities integral with via/contact opening at the at least two interfaces.

The present invention is further directed to an electronic device that includes a substrate, at least one sandwiched structure of a BPTEOS oxide layer situated between two TEOS oxide layers on the substrate forming at least two boundaries, a generally columnar-shaped opening in the at least one sandwiched structure, and at least two toroidal-shaped cavities extending outwardly from an integral with the via/contact opening at the at least two boundaries.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a novel method of anchoring a via or contact by in-situ forming a via/contact opening utilizing a deep UV photoresist containing a photo-acid-generator such that toroidal-shaped cavities can be formed in the opening to allow the formation of anchors on the via/contact. The present invention novel method of forming anchors can be incorporated into the process recipe and carried out in-situually.

In the photolithography of semiconductor devices, it is known that various photoresist materials can be used in various applications, for instance, when a mercury-xenon arc source is used, the dominant wavelengths are 254 nm for deep UV, 313 nm and 365 nm for the I-line, 405 nm for the H-line and 436 nm for the G-line. Normally four smaller feature sizes, the lens can be corrected for one or two of the wavelengths at or smaller than 250 nm such that filters are used to remove the rest of the spectrum. The use of the shorter wavelengths reduces the beam intensity and therefore increases the exposure time.

In modern semiconductor device manufacturing, the G-line can be used for feature sizes down to approximately 0.8 $\mu$m, the I-line for sizes in the range between 0.4~0.8 $\mu$m. For even smaller feature sizes, i.e., below 0.4 $\mu$m, shorter exposure wavelengths such as deep UV at 248~254 nm of very sensitive deep UV photoresist is required. Generally, the shorter wavelengths of the exposure light, the higher resolution can be obtained on the device. Several commercially available deep UV photoresist are available such as PMMA supplied by Tokyo-OKA under the tradename of "ODUR®"-120 which has a sensitivity for wavelengths smaller than 2.50 nm. Other deep UV photoresist such as Novolac resin supplied by Shipley as "MICROPOSIT®" 2400 can be used for sensitivity at wavelengths of 250 nm. One important class of deep UV photoresist are the chemically amplified resists which exhibit high photo-speed, high resolution and superior process tolerances. These chemically amplified resist consists of a polymeric base and a generator of acid in the presence of light (sometimes called photo-acid-generator). In the post-exposure bake process, the photo generated acid catalyzes thermal reactions that changes the solubility of the exposed region. The resolution and sensitivity of the resist are therefore affected by the post-exposure baked conditions. This can be shown by the following:

$DUV\ PR + UV \rightarrow H^+$(trace amount)Heat $H^+H^+H^+H^+$

Figure 1:
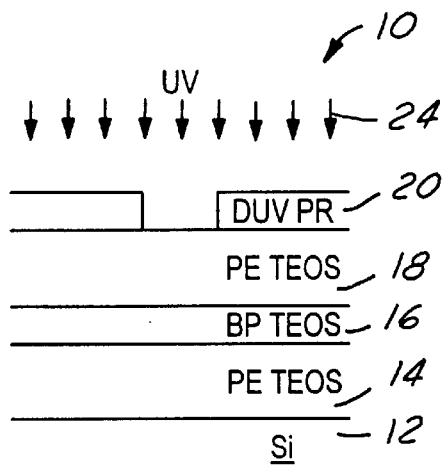
FIG. 1 is an enlarged, cross-sectional view of a present invention semiconductor device that has two PETEOS oxide layers and one BPTEOS oxide layer deposited thereon and a deep UV photoresist layer deposited and patterned on top of one of the PETEOS oxide layer.
Figure 2:
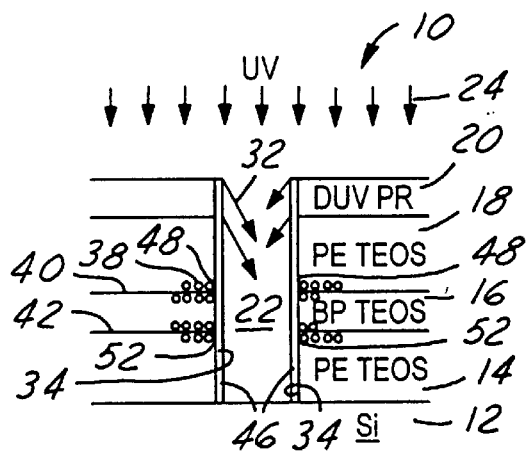
FIG. 2 is an enlarged, cross-sectional view of the present invention semiconductor device shown in FIG. 1 after exposing to UV radiation and an etching through a via/contact opening having a fluorine and hydrogen containing organic compound coated on the sidewalls of the opening.

It is seen that when a deep UV photoresist layer is subject to a UV radiation, a trace amount of hydrogen ions are formed and emitted from the photoresist layer. This is shown in FIGS. 1 and 2. When the semiconductor device is heated in a reactive ion etching process (or a high density plasma etching process), the device heats up to approximately 120° C. and greatly accelerates the hydrogen ion production.

Referring initially to FIG. 1, wherein a present invention semiconductor device 10 is shown. Semiconductor device 10 consists of a silicon substrate 12, a first PETEOS oxide layer 14, a first BPTEOS oxide layer 16 and a second PETEOS oxide layer 18 deposited on top. The deposition of these layers are carried out by standard deposition processes used in the semiconductor fabrication industry. For instance, A deep UV photoresist layer 22 is deposited and patterned on top of the second PETEOS oxide layer 18. During patterning, the photoresist layer 20 is subjected to a UV radiation 24 which triggers the reaction in the photoresist layer to emit hydrogen ions 32, as shown in FIG. 2. It should be noted that, traditionally, only I-line photoresist layers have been used to form openings for via/contact.

In the present invention novel method, a deep UV photoresist layer 20 is deposited on top of the semiconductor device 10 and then the device is subjected to UV radiation 24. After UV radiation, the photoresist layer 20 which contains a photo-acid-generator changes to an acidic nature, i.e., containing a large content of acid. During a reactive ion (RIE) etching process, the photoresist layer 20 may be again exposed to UV radiation. The certain etch chambers, such as Applied Materials Omega 5300, there is UV emission due to chamber geometry. The UV radiation of the semiconductor device 10 during the etching process can therefore be achieved in-situ.

After a via/contact opening 22 is etched by the RIE process, hydrogen ions 32 emits from the deep UV photoresist layer 20 and bombards the sidewalls 34 of the opening 22. At the same time, boron and phosphorous ions 38 diffuse to the interface 40 and 42 between the BPTEOS layer 16 and the PETEOS layer 18 and 14, respectively. At the interfaces 40 and 42, there is therefore a saturation of boron and phosphorous ions at the boundaries between the BPTEOS oxide and the PETEOS oxide.

The bombardment of hydrogen ions 32 from the UV photoresist layer 20 onto the sidewalls 34 of the opening 22 reacts with the fluorine content in the oxide layers such that a fluorine and hydrogen containing organic compound 46 is formed coating the sidewalls 34. The migration or diffusion of boron and phosphorous ions 38 to the interfaces 40 and 42 decreases the density of the oxide materials found at the interfaces. Furthermore, a small moisture content in the process chamber reacts with the fluorine ions to form HF which is a strong acid for etching away the interfacial layer at 48 and 52. As a result, cavities 58 of generally a toroidal-shape are formed. This is in shown in FIG. 3. The fluorine and hydrogen containing organic compound layer 46 coated on the sidewalls 34 of the opening 22 also contributes to the etching of the cavities 58 and 60. The present invention via/contact anchors therefore can be automatically formed from the cavities 58, 60 by an in-situ RIE process for forming the via/contact opening 22. It should be noted that while reactive ion etching method is illustrated in the preferred embodiment, any other similar plasma etching process can also be used. These include high density plasma (HDP) etching, transformer coupled plasma (TCP) etching and inductive coupled plasma (ICP) etching methods.

It should be noted that to carry out the present invention novel method of anchor forming, a deep UV photoresist material that contains a photo-acid-generator must be used. Other type of photoresist material, i.e., I-line photoresist does not work since they do not provide similar chemistry of generating hydrogen ions. The requirement of the deep UV photoresist layer to generate hydrogen ions while being irradiated by UV radiation is therefore very important. The irradiation by UV can be achieved by different methods. For instance, before the dry or plasma etching process, the photoresist layer can be exposed to UV radiation in order to produce hydrogen ions on the surface. Alternatively, during the plasma etching process, the etch chamber may produce UV radiation in-situ, for instance, in an Applied Materials Omega etcher.

It should also be noted that the deep UV photoresist layer should not be stripped or removed from the semiconductor structure 10 immediately after the etching process. It is desirable to maintain the photoresist layer for a time period between about 20 minutes and about 2 hours, preferably between about 30 minutes and 1 hour in order to generate enough hydrogen ions for the formation of HF acid. In the preferred embodiment, the photoresist layer 20 was kept on the semiconductor structure 10 for approximately 1 hour while the structure 10 was subjected to UV radiation 24 (FIG. 2). It has been found that either an I-line or G-line photoresist material would not work in the present invention novel method. Even after exposure to UV radiation in the presence of fluorine ions, the sidewall 34 of the via/contact opening 22 are not etched away to form cavities 58, 60.

The ability of generating high acidity by the photo-acid-generator contained in the deep UV photoresist layer 20 is therefore an important prerequisite of the present invention novel method. It has been found, as shown by equation A ( . . . Equation (A) DUV PR+UV→$H^+$ (trace amount) Heat $H^+H^+H^{+H+}$. . .), after the deep UV photoresist layer is exposed to UV radiation, only a trace amount of hydrogen ions are produced. However, during a reactive ion etching process, the temperature of the semiconductor device 10 is normally increased to approximately 120° C. This higher temperature greatly increases the production rate of hydrogen ions to speed up the present invention sidewall etching process to form cavities at the interfaces 40 and 42. The heating step by the etching process therefore contributes to the ready formation of the cavities for the subsequent formation of anchors on the via/contact. It is believed that a chain-transfer reaction occurs at higher temperatures, i.e., at 120° C., to enable the large generation of hydrogen ions and the subsequent etching of the cavities.

The thickness at the thickest portion of the cavity 58, 60 is approximately one third of the thickness of the BPTEOS oxide layer 16. Since the thickness of the BPTEOS oxide layer is approximately 3000 Å, the thickness of the cavities 58, 60 is approximately 1000 Å. The UV radiation exposure can be accomplished by using normal UV sources at a wavelength of smaller than 400 nm. In etch chambers that provides UV emission, such UV treatment is sufficient for the generation of hydrogen ions from the deep UV photoresist layer, however, in other etcher such as a TEL 8500 etch chamber, there is no UV emission and therefore prior to the etching process, the semiconductor device 10 must first be exposed to UV radiation in a separate chamber. The off-line UV treatment on the semiconductor device is therefore required whenever the etch chamber does not produce UV emissions.

Figure 3:
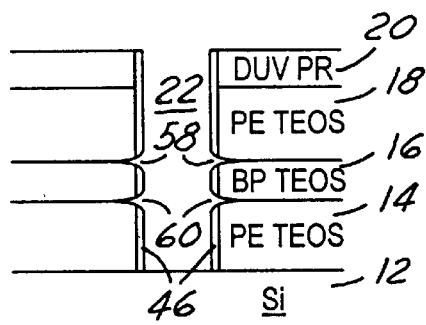
FIG. 3 is the present invention semiconductor structure of FIG. 2 with the toroidal-shaped cavities formed at the interfaces between the PETEOS oxide layers and the BPTEOS oxide layer while maintaining the deep UV photoresist layer on top.

A multiple number of two of cavities can be produced for each BPTEOS oxide layer 16. This is shown in FIG. 3. When larger number of anchors are desired, more layers of BPTEOS oxide can be used to produce 4, 6, 8, . . . anchors on the via/contact.

Figure 4:
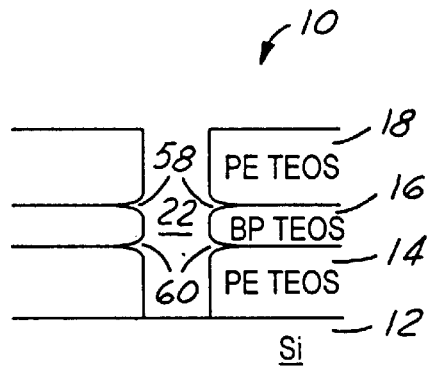
FIG. 4 is an enlarged, cross-sectional view of the present invention semiconductor structure of FIG. 3 with the deep UV photoresist layer and the fluorine and hydrogen containing organic compound removed from the via/contact opening.
Figure 5:
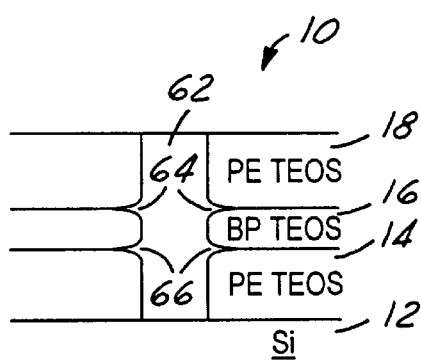
FIG. 5 is an enlarged, cross-sectional view of the present invention semiconductor structure shown in FIG. 4 having a conductive metal deposited into said via/contact opening.

After the formation of the cavities 58, 60, the photoresist layer 20 may be removed by a dry etching combined with a wet etching method. This is shown in FIG. 4. During the dry/wet etching process, the fluorine and hydrogen containing organic compound layer 46 on the sidewall 34 is also removed. This leaves a clean sidewall 34 of the via/contact opening 22 ready for the deposition of a conductive metal. It should be noted that any suitable conductive metal, aluminum, aluminum alloys, tungsten, tungsten alloys, etc., can be used for filling the opening 22 and forming the via/contact 62, as shown in FIG. 5. The anchors 64 and 66 are therefore formed integrally with the via/contact 62 extending outwardly from the body of the via/contact. The anchors prevents a via/contact delamination or separation from the device 10. Such delamination or separation occurs when the device 10 is subjected to numerous thermal cycles during subsequent processes such as etching, planarization and reflow processes. It should be noted that the thickness of the fluorine and hydrogen containing organic compound 46 (FIG. 2) is between about 300 and about 500 Å.

Figure 6:
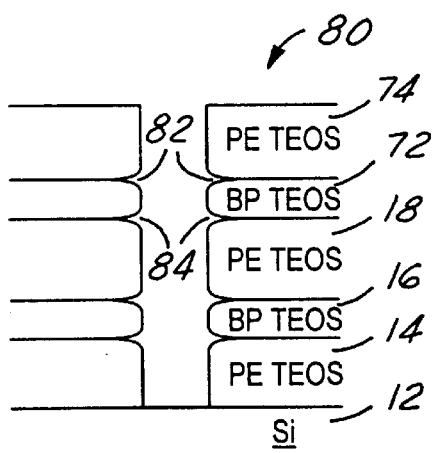
FIG. 6 is an enlarged, cross-sectional view of the present invention semiconductor structure having three PETEOS oxide layers deposited with two BPTEOS oxide layers thereinbetween and having four toroidal-shaped cavities formed in the via/contact opening.

When more than two anchors are desired, as shown in FIG. 6, more layers of BPTEOS 72 and PETEOS oxide 74 are used. For each BPTEOS oxide layer added, two more anchors 82, 84 are added to the semiconductor device 80. For instance, if six anchors are desired on the via/contact, three layers of BPTEOS oxide should be deposited and sandwiched in-between PETEOS oxide layers. The present invention novel method is therefore not limited by the number of anchors that can be formed automatically in the plasma etching process for forming the via/contact.

The present invention novel method of forming anchors can also be used for other semiconductor structures or devices. For instance, it can be suitably used in forming capacitors that has greatly increased surface areas. For instance, a series of anchors, i.e., 2, 4, 6, 8, . . . , can be added to a columnar-type capacitor and significantly increasing its surface area. Such a capacitor would have significantly increased capacitance due to its enlarged surface areas. The present invention novel method is therefore in no way limited to the formation of anchors on via/contact or improved capacitors, any other structures that would benefit from anchor formations may also suitably use the present invention novel method.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for anchoring a via/contact in an electronic device comprising the steps of:
    providing an electronic device,
    depositing at least one layer of BPTEOS oxide and at least two layers of TEOS oxide layers in an alternating manner with said BPTEOS oxide layer sandwiched in-between said TEOS oxide layers forming at least two interfaces between said layers of different materials,
    depositing a photoresist comprises a photo-acid-generator on top of a TEOS oxide layer, and
    exposing said photoresist layer to a UV radiation prior to or during a plasma etching process in which a via/contact opening is opened in said layers of BPTEOS oxide and TEOS oxide, said etching process being conducted for a length of time sufficient to form at least two toroidal-shaped cavities integral with said opening at said at least two interfaces.

2. A method according to claim 1, wherein said electronic device is a semiconductor structure formed on a semi-conducting substrate.

3. A method according to claim 1, wherein said at least one BPTEOS oxide layer is deposited to a thickness between about 1000 Å and about 5000 Å and preferably between about 2000 Å and about 4000 Å, while said at least two TEOS oxide layers are deposited to a thickness between about 2000 Å and about 10000 Å and preferably between about 4000 Å and about 8000 Å.

4. A method according to claim 1, wherein said photoresist layer deposited is a deep UV photoresist capable of generating acid in the presence of UV radiation.

5. A method according to claim 1 further comprising the step after said plasma etching process of depositing a conductive metal into said vial contact opening and said at least two toroidal-shaped cavities forming a via/contact having at least two integrally formed anchors.

6. A method according to claim 5 further comprising the step after said conductive metal deposition process of removing said photoresist layer by a dry etching and a wet etching method.

7. A method according to claim 1, wherein said at least two toroidal-shaped cavities having a thickness at their thickest section between about 200 Å and about 2000 Å, and preferably between about 500 Å and about 1500 Å.

8. A method according to claim 1, wherein said plasma etching process is conducted by a method selected from the group consisting of reactive ion etching, high density plasma etching, transformer coupled plasma etching and inductive coupled plasma etching.

9. A method according to claim 1, wherein said length of time sufficient to form at least two toroidal-shaped cavities integral with said vial/contact opening is not less than 30 minutes, and preferably not less than 1 hour.

10. A method according to claim 1, wherein said plasma etching process produces a fluorine and hydrogen containing organic material coating on the sidewalls of said via/contact opening to etch away said at least two toroidal-shaped cavities.

11. A method according to claim 1, wherein said photo-acid-generator produces a trace amount of hydrogen ions when said photoresist layers is exposed to a UV radiation, said trace amount of hydrogen ions greatly increases when said electronic device is heated up during plasma etching process.

12. A method according to claim 1, wherein said via/contact opening is filled with a semi-conducting material and a dielectric material to form a capacitor in said electronic device.

13. A method for preventing via/contact delamination in a semiconductor device comprising the steps of:
    providing a pre-processed semiconductor device,
    depositing alternating layers of TEOS oxide and BPTEOS oxide forming at least one sandwiched structure of a BPTEOS oxide layer sandwiched in-between two TEOS oxide layers and at least two interfaces between said BPTEOS oxide sand said TEOS oxide layers,
    depositing a layer of photoresist material comprising a photo-acid-generator on top of one of said TEOS oxide layers,
    exposing said photoresist to a UV radiation,
    plasma etching a via/contact opening in said alternating layers of TEOS oxide and BPTEOS oxide and coating the sidewalls of said via/contact opening with a fluorine and hydrogen containing organic compound formed by said photoresist material, and
    forming at lest two toroidal-shaped cavities integral with said via/contact opening at said at least two interfaces.

14. A method according to claim 13, wherein said plasma etching step is conducted for a length of time sufficient to form said fluorine and hydrogen containing organic compound such that said at least two toroidal-shaped cavities may be etched away at said at least two interfaces.

15. A method according to claim 14, wherein said length of time is not less than 30 minutes and preferably not less than 1 hour.

16. A method according to claim 13, wherein said plasma etching process produces a passivation layer covering said sidewalls of the via/contact opening, said passivation layer being formed of a fluorine and hydrogen containing organic compound.

17. A method according to claim 13, wherein said photoresist layer is a deep UV photoresist capable of generating acid in the presence of light of $\lambda < 400$ nm.

18. A method according to claim 13 further comprising the step of filling said via/contact opening and said at least two toroidal-shaped cavities with a conductive metal.

19. A method according to claim 18, wherein said conductive metal comprises a material selected from the group consisting of tungsten, tungsten alloy, aluminum and aluminum alloy.

20. A method according to claim 13, wherein said via/contact opening is filled with a semi-conducting material and a dielectric material for forming a capacitor in said semiconductor device.

21. An electronic device comprising:
   a substrate,
   at least one sandwiched structure of a BPTEOS oxide layer situated between two TEOS oxide layers on said substrate forming at least two boundaries,
   a generally columnar-shaped opening in said at lest one sandwiched structure, and
   at least two toroidal-shaped cavities extending outwardly from said via/contact opening at said at least two boundaries.

22. An electronic device according to claim 21, wherein said electronic device is a semiconductor chip.

23. An electronic device according to claim 21 further comprising a conductive metal filling said generally columnar-shaped opening and said at lest two toroidal-shaped cavities forming a via/contact having at least two anchors.

24. An electronic device according to claim 21, wherein said device comprises at least two sandwiched structures of a BPTEOS oxide layer situated between two TEOS oxide layers on said substrate forming at least four boundaries and at least four toroidal-shaped cavities extending outwardly from said generally columnar-shaped opening at least four boundaries.

25. An electronic device according to claim 21, wherein said device comprises at least three sandwiched structures of a BPTEOS oxide layer situated between two TEOS oxide layers on said substrate forming at least six boundaries and at least six toroidal-shaped cavities extending outwardly from said generally columnar-shaped opening at least six boundaries.

26. An electronic device according to claim 21, wherein said generally columnar-shaped opening is filled with a semi-conducting material and a dielectric material forming a capacitor.

* * * * *

UNITED STATES PATENT AND TRADEMARK OFFICE
CERTIFICATE OF CORRECTION

PATENT NO. : 5,899,748
DATED : May 4, 1999
INVENTOR(S) : Chia Shiung Tsai and Hun-Jan Tao It is certified that error appears in the above-indentified patent and that said Letters Patent is hereby corrected as shown below:

Column 6, line 10, please delete "Heat $H^+H^+H^+H^+$ ...) and substitute therefore:

--Heat $H^+$ $H^+H^+H^+$...) --.

Signed and Sealed this

Second Day of November, 1999

Attest:

Q. TODD DICKINSON

Attesting Officer   Acting Commissioner of Patents and Trademarks